(12) United States Patent
Ohmi et al.

(10) Patent No.: US 8,134,376 B2
(45) Date of Patent: Mar. 13, 2012

(54) METHOD OF MEASURING ELECTRONIC DEVICE AND MEASURING APPARATUS

(75) Inventors: Tadahiro Ohmi, Miyagi (JP); Akinobu Teramoto, Miyagi (JP)

(73) Assignee: Tohoku University, Sendai-Shi (JP)

( * ) Notice: Subject to any disclaimer, the term of this patent is extended or adjusted under 35 U.S.C. 154(b) by 0 days.

(21) Appl. No.: 11/795,247

(22) PCT Filed: Jan. 17, 2006

(86) PCT No.: PCT/JP2006/000476
§ 371 (c)(1),
(2), (4) Date: Jul. 13, 2007

(87) PCT Pub. No.: WO2006/075750
PCT Pub. Date: Jul. 20, 2006

(65) Prior Publication Data
US 2008/0204050 A1    Aug. 28, 2008

(30) Foreign Application Priority Data
Jan. 17, 2005    (JP) .................................. 2005-009482

(51) Int. Cl.
*G01R 27/08*    (2006.01)

(52) U.S. Cl. ....................................................... 324/691

(58) Field of Classification Search .................... 324/691
See application file for complete search history.

(56) References Cited

U.S. PATENT DOCUMENTS

| 4,878,019 | A  | * | 10/1989 | Tsaprazis et al. | ............. | 324/204 |
| 5,420,507 | A  | * | 5/1995  | Laskowski        | ...................  | 324/236 |
| 5,793,640 | A  | * | 8/1998  | Wu et al.        | .........................  | 702/65  |
| 6,184,688 | B1 | * | 2/2001  | Kamitani         | ......................  | 324/519 |
| 6,246,242 | B1 | * | 6/2001  | Sakai            | .............................  | 324/549 |
| 6,321,169 | B1 | * | 11/2001 | Iwao             | ................................  | 702/65  |
| 6,546,512 | B1 | * | 4/2003  | Ochoa et al.     | ..................  | 714/724 |
| 2001/0004210 | A1 | * | 6/2001 | Harada | ......................... | 324/224 |
| 2002/0070731 | A1 | * | 6/2002 | Ohminami | ..................... | 324/548 |

FOREIGN PATENT DOCUMENTS

| JP | 47-12711  | 4/1972  |
| JP | 54-005770 | 1/1979  |
| JP | 61-209361 | 9/1986  |
| JP | 08-278336 | 10/1996 |
| JP | 9-145761  | 6/1997  |
| JP | 10-293137 | 11/1998 |
| JP | 11-142451 | 5/1999  |

OTHER PUBLICATIONS

Ohura et al., "Electrical Electronic Measurement," Shokodo Co., Ltd., p. 106, Mar. 10, 2002.
Japan Patent Office office action on application No. 2005-009482 dated Apr. 6, 2011; pp. 1-2.

* cited by examiner

*Primary Examiner* — Jeff Natalini
(74) *Attorney, Agent, or Firm* — Foley & Lardner LLP

(57) ABSTRACT

In a method for measuring an electronic device which is an object to be measured, a passive element is connected to the electronic device in parallel, and electric parameters of the electronic device are extracted by measuring an impedance of the entire circuit.

5 Claims, 5 Drawing Sheets

[Fig. 1]
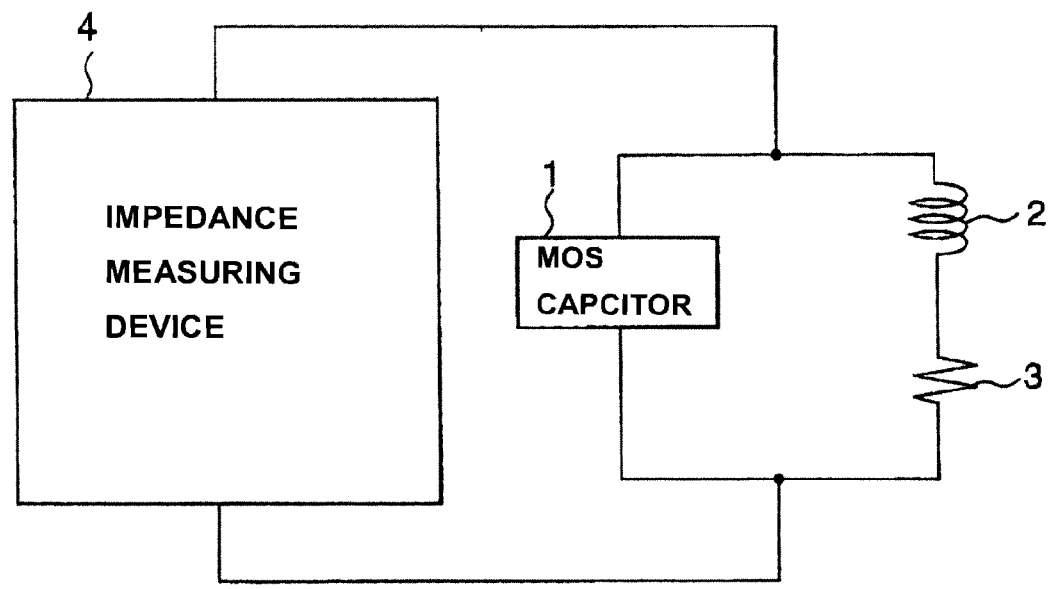
[Fig. 2]
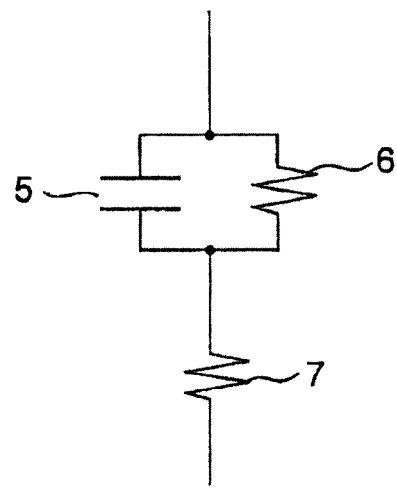

[Fig. 3]
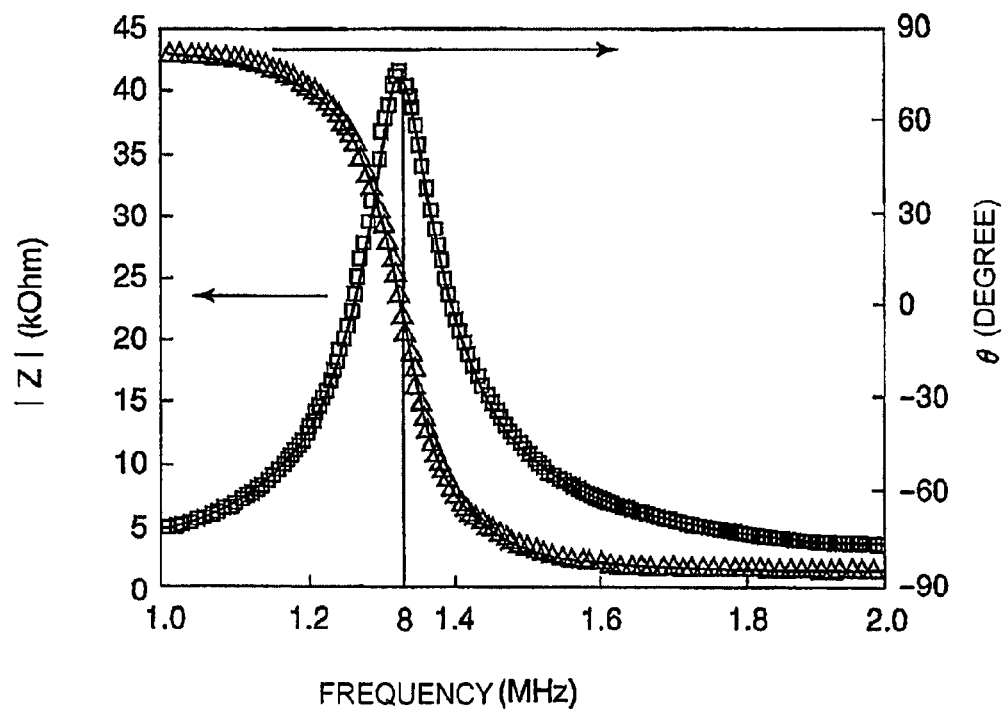
[Fig. 4]
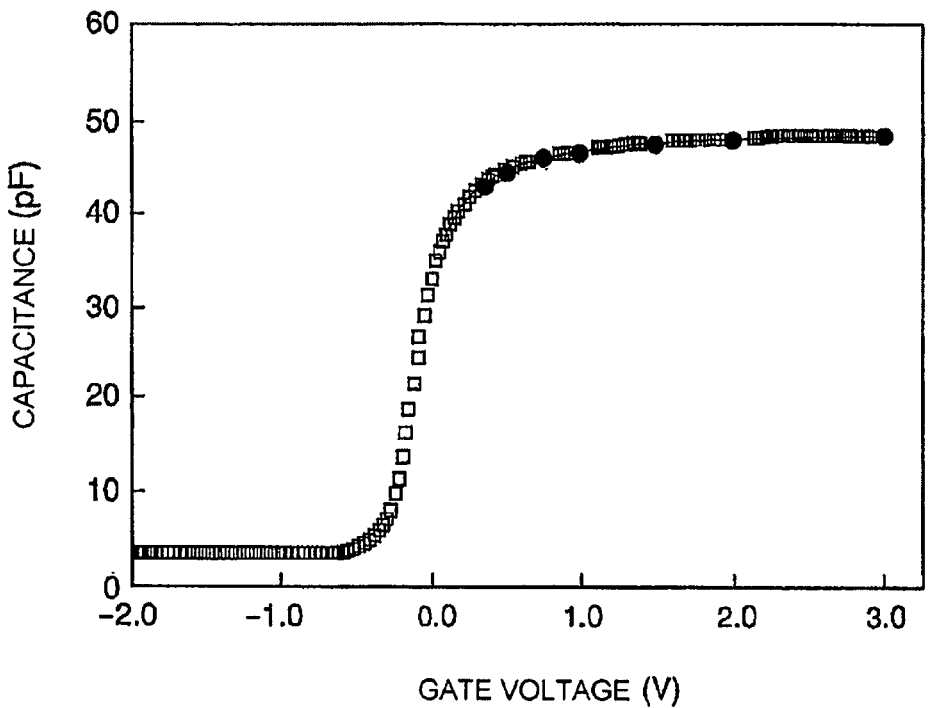

[Fig. 5]
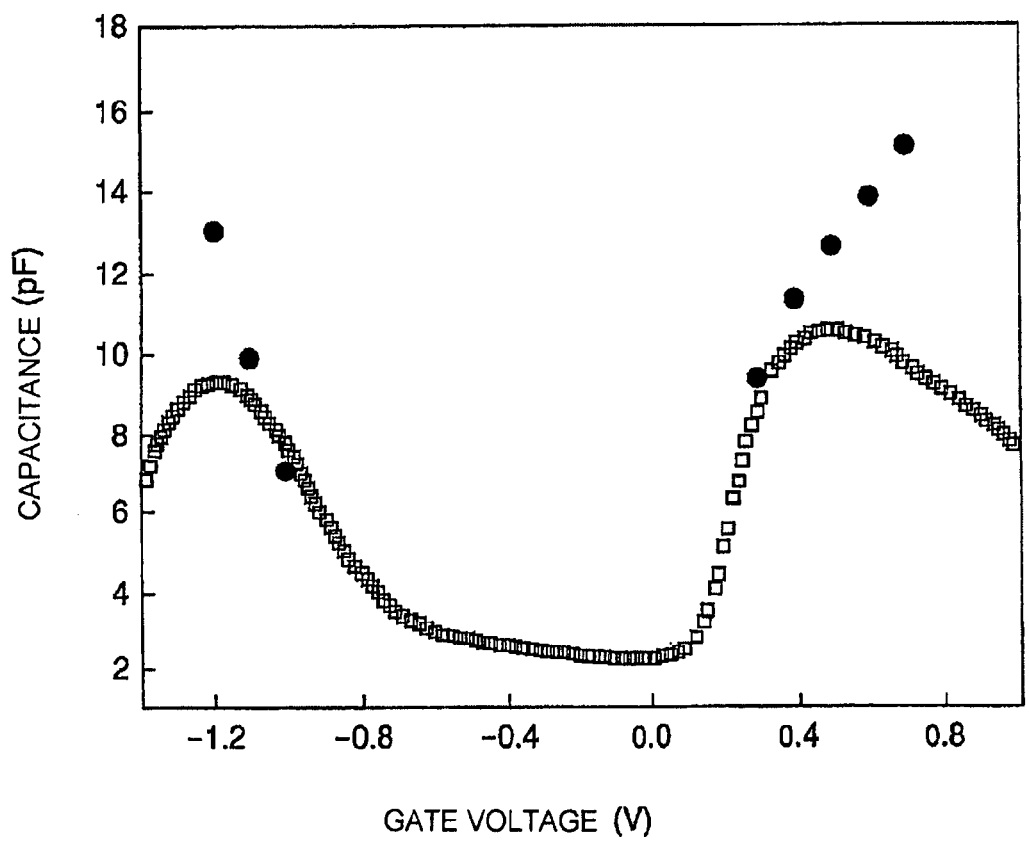

[Fig. 6]
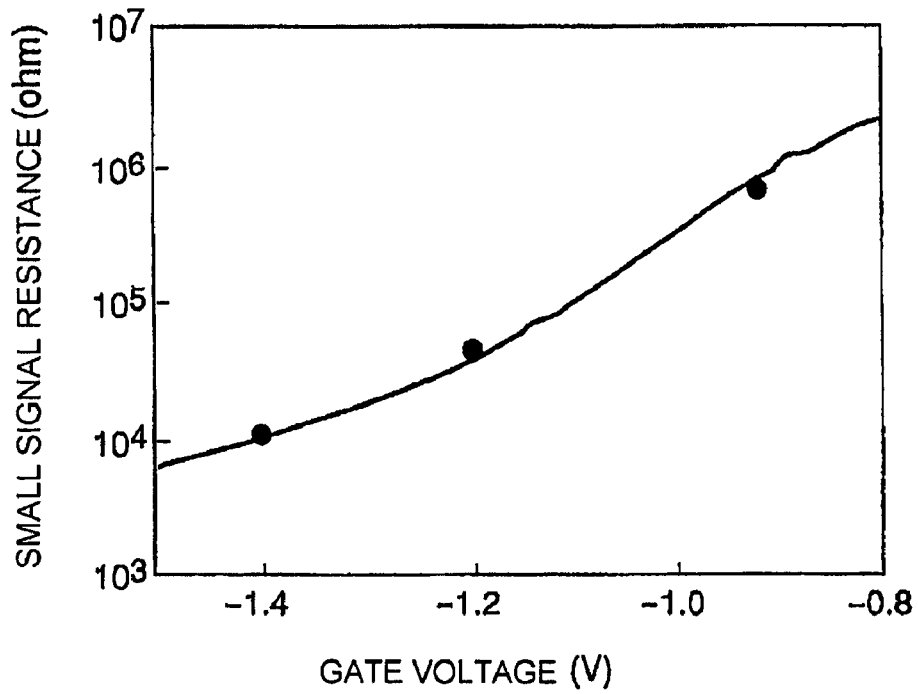
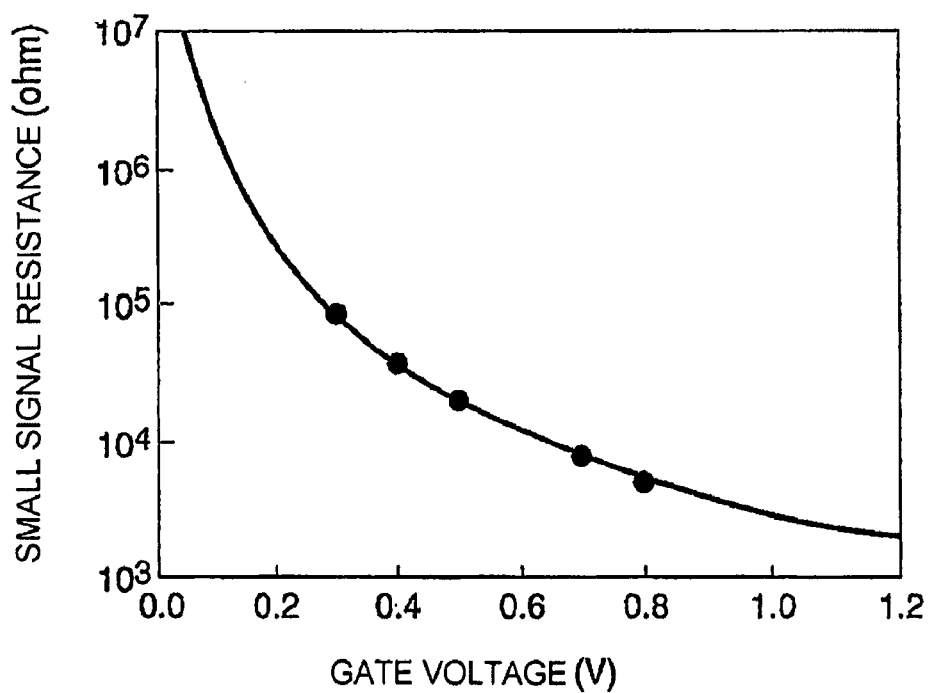

[Fig. 7]
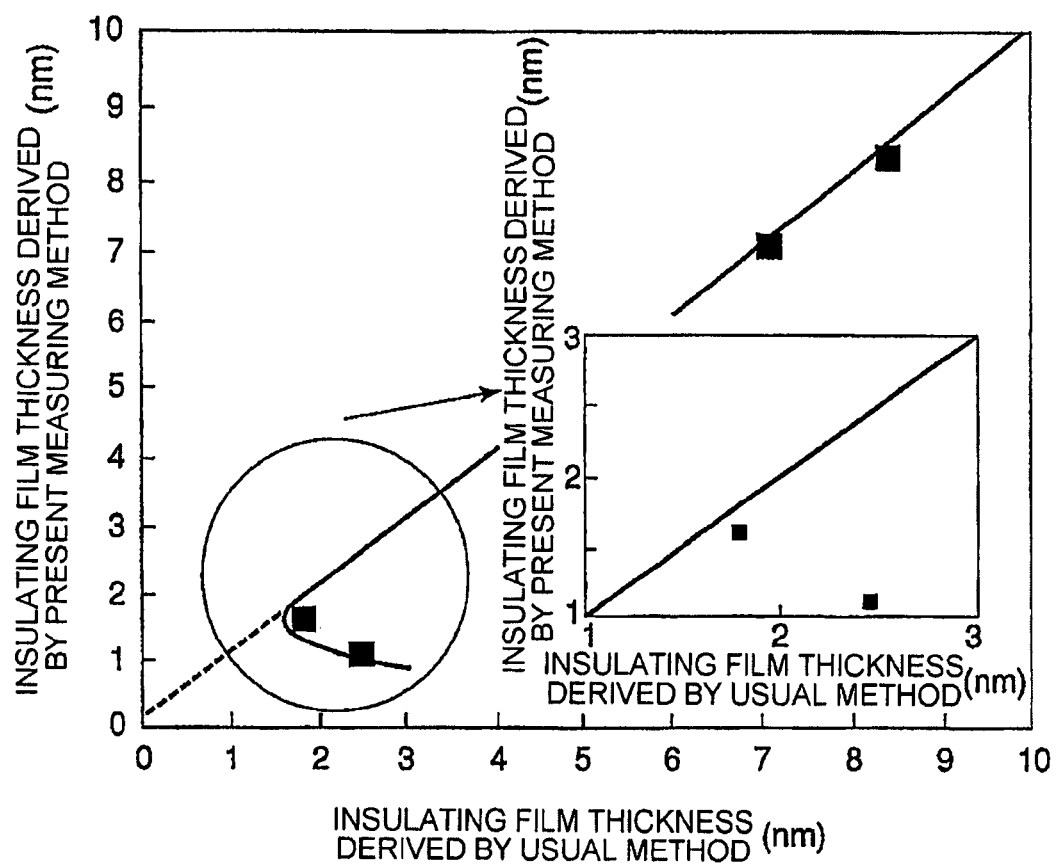

METHOD OF MEASURING ELECTRONIC DEVICE AND MEASURING APPARATUS

TECHNICAL FIELD

This invention relates to a measuring method and apparatus for extracting an electrical parameter of an electronic device such as a semiconductor device.

BACKGROUND ART

Conventionally, the capacitance, inductance, and resistance of an electronic device are measured at a measurement frequency of about 100 Hz to 1 MHz using an auto-balancing bridge method (see Noritoku Ohura and Matsuo Sekine, "ELECTRICAL ELECTRONIC MEASUREMENT", Shokodo Co., Ltd., p. 106, Mar. 10, 2002).

DISCLOSURE OF THE INVENTION

Problem to be Solved by the Invention

However, the foregoing conventional technique has a problem that if the current passing through a measurement object increases, it is difficult to measure the capacitance component thereof.

Therefore, this invention has been made in view of the problem of the foregoing conventional technique and has an object to enable accurate measurement of an electrical parameter of a measurement object even in a measurement range where an excessive current flows in parallel.

Means for Solving the Problem

In order to achieve the aforementioned object, according to the present invention, in a method of measuring an electronic device as a measurement object; comprising: connecting a passive element in parallel with the electronic device, and measuring an impedance of an entire circuit to thereby extract an electrical parameter of the electronic device.

Further, according to the present invention, in a measuring apparatus for measuring an electronic device as a measurement object, wherein: a passive element is connected in parallel with the electronic device, and an electrical parameter of the electronic device is extracted by measuring an impedance of an entire circuit using an impedance measuring device connected between both terminals of the electronic device.

Herein, the passive element comprises an inductance and a resistance connected in series with the inductance. For example, the electrical parameter is an electrical capacitance.

The measurement is preferably performed by causing a resonance phenomenon. Further, a current which flows between the terminals is 7 μA or more. For example, the electronic device is a semiconductor device.

As described above, in this invention, the known passive element is added to the electronic device as the measurement object, the impedance of the entire circuit is measured, and the electrical parameter of the measurement object is extracted from its equivalent circuit.

Effect of the Invention

According to this invention, it is possible to accurately measure an electrical parameter of a measurement object even in a measurement range where an excessive current flows in parallel.

BRIEF DESCRIPTION OF THE DRAWINGS

FIG. 1 A circuit diagram showing a measurement system according to this invention.

FIG. 2 A diagram showing an equivalent circuit of a MOS capacitor.

FIG. 3 A diagram showing a graph representing the measurement frequency dependence of impedance measured by the present measurement and the measurement frequency dependence of impedance derived by performing parameter fitting.

FIG. 4 A diagram showing a graph representing the relationships between voltage and capacitance obtained by measuring a MOS capacitor having a gate insulating film with an insulating film thickness of 8.5 nm according to the usual measuring method and the present measuring method.

FIG. 5 A diagram showing a graph representing the relationships between voltage and capacitance obtained by measuring a MOS transistor having a gate insulating film with an insulating film thickness of 1.18 nm according to the usual measuring method and the present measuring method.

FIG. 6A and 6B Are diagrams showing current values when the voltage is applied to the MOS transistor having the gate insulating film with the insulating film thickness of 1.18 nm.

FIG. 7 A diagram showing the relationship between insulating film thickness derived by the usual method and insulating film thickness derived by the present measuring method.

BEST MODE FOR CARRYING OUT THE INVENTION

First Embodiment

As shown in FIG. 1, an inductance (L) 2 and a resistance (R) 3 are added in parallel with a MOS capacitor 1 as a measurement object and both ends thereof are connected to an impedance measuring device 4.

As shown in FIG. 2, an equivalent circuit of the MOS capacitor 1 can be expressed using a capacitance (Ci) 5, a parallel resistance (Rp) 6, and a series resistance (Rs) 7. Herein, an impedance Z1 of the MOS capacitor 1, an impedance Z2 of the added inductance 2 and resistance 3, and the total impedance Z are given by formulas 1, wherein ω represents a measurement frequency.

$$Z1 = \frac{Rp + Rs + j\omega CiRpRs}{1 + j\omega CiRp}, Z2 = R + j\omega L \quad \text{[Formulas 1]}$$

$$Z = \frac{R(Rp + Rs) - \omega^2 LCiRpRs + j\omega\{CiRpRs + L(Rp + Rs)\}}{Rp + Rs + R - \omega^2 LCiRp + j\omega\{L + CiRp(Rs + R)\}}$$

Further, a resonance frequency ωr is given by formula 2.

$$\omega_r = \sqrt{\frac{L(Rp + Rs)^2 - CiRp^2 R}{L^2 CiRp^2 + LCi^2 Rp^2 Rs^2}} \quad \text{[Formula 2]}$$

By selecting L (330 μH) of the added inductance 2 and R (100Ω) of the added resistance 3 so that ωr becomes 2 MHz or less, the inductance component of the measurement system is ignored. Herein, L of the added inductance 2 and R of the added resistance 3 may be selected for ωr so that the inductance of the measurement system takes a value sufficiently smaller than Z.

When the frequency dependence of Z is measured in this state, there are obtained measured values given by □ and Δ in FIG. 3. Using the foregoing formula at a resonance frequency point 8, Rp, Rs, and Ci are derived by numerical fitting. Curves shown in solid lines in FIG. 3 represent |Z| and w at other frequencies calculated using the derived values.

FIG. 4 shows the relationship between capacitance and applied voltage derived therefrom and the relationship between capacitance and voltage derived by the usual auto-balancing bridge method.

What are indicated by black squares are derived by the usual method and what are indicated by • are derived by the present measuring method. The insulating film thickness of the MOS capacitor derived from Ci thus obtained is 8.5 nm.

Second Embodiment

A MOS transistor having a gate insulating film thickness of about 1.18 nm is measured in the same manner as in the first embodiment. L of an added inductance 2 and R of an added resistance 3 are 33 mH and 100Ω, respectively. FIG. 5 shows the relationship between capacitance and applied voltage thereupon and the relationship between capacitance and voltage derived by the usual auto-balancing bridge method.

What are indicated by black squares are derived by the usual method and what are indicated by • are derived by the present measuring method. Here, in the relationship between capacitance and voltage derived by the usual auto-balancing bridge method, the capacitance decreases where the voltage is large for both positive and negative voltages.

This is because, as shown in FIGS. 6, (A) and (B), when the applied voltage increases, the capacitance cannot be accurately measured due to increase in current. When a current value becomes about 7 µA or more, reduction in capacitance value is observed. On the other hand, when measured by the present measuring method, increase in capacitance is observed following increase in absolute value of voltage. Thus, it is understood that the measurement is accurately performed.

FIG. 7 shows the relationship between insulating film thickness derived by the usual method and insulating film thickness derived by the present measuring method.

According to the usual method, the measurement is not accurately performed in a thin film range (a range where an excessive current flows in a measurement range) so that the film thickness increases, while, according to the present measuring method, the measurement is accurately performed even in that range.

INDUSTRIAL APPLICABILITY

According to this invention, an electrical parameter of a measurement object can be accurately measured even in a measurement range where an excessive current flows in parallel. As a result, the measuring method and the measuring apparatus of this invention are applicable to electronic devices such as semiconductor devices.

The invention claimed is:

1. A method of measuring an electronic device as a measurement object, comprising:
connecting a passive element in parallel with the electronic device, and
measuring an impedance of an entire circuit using an impedance measuring device connected between both terminals of the electronic device to thereby extract an electrical parameter of the electronic device,
wherein the entire circuit is structured by the electronic device and the passive element,
wherein a current which flows between the terminals of the electronic device is 7 µA or more and the electronic device is a semiconductor device,
wherein the passive element comprises an inductance and a resistance connected in series with the inductance, and
wherein the measurement is performed by causing a resonance phenomenon.

2. The method of measuring the electronic device according to claim 1, wherein:
the electrical parameter is an electrical capacitance.

3. A measuring apparatus for measuring an electronic device as a measurement object, comprising:
a passive element connected in parallel with the electronic device, and
an impedance measuring device connected between both terminals of the electronic device
wherein:
an entire circuit is structured by the electronic device and the passive element, and
an electrical parameter of the electronic device is extracted by measuring an impedance of the entire circuit using the impedance measuring device,
wherein a current which flows between the terminals of the electronic device is 7 µA or more and the electronic device is a semiconductor device,
wherein the passive element comprises an inductance and a resistance connected in series with the inductance, and
the measurement is performed by causing a resonance phenomenon.

4. The measuring apparatus for measuring the electronic device according to claim 3, wherein:
the electrical parameter is an electrical capacitance.

5. A measuring apparatus for measuring an electronic device as a measurement object, comprising:
a known passive element is connected in parallel with the electronic device, and
an impedance measuring device connected between both terminals of the electronic device,
wherein:
an entire circuit is structured by the electronic device and the passive element, and
an electrical parameter of the electronic device is extracted by measuring an impedance of the entire circuit using the impedance measuring device,
wherein a current which flows between the terminals is 7 µA or more and the electronic device is a semiconductor device,
wherein the passive element comprises an inductance and a resistance connected in series with the inductance, and
the measurement is performed by causing a resonance phenomenon.

* * * * *